(12) United States Patent
Morse

(10) Patent No.: US 7,082,248 B1
(45) Date of Patent: Jul. 25, 2006

(54) SEMICONDUCTOR WAVEGUIDE-BASED AVALANCHE PHOTODETECTOR WITH SEPARATE ABSORPTION AND MULTIPLICATION REGIONS

(75) Inventor: Michael T. Morse, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/243,325

(22) Filed: Oct. 4, 2005

Related U.S. Application Data

(62) Division of application No. 11/121,511, filed on May 3, 2005.

(51) Int. Cl.
G02B 6/10 (2006.01)

(52) U.S. Cl. ..................... 385/131; 257/136
(58) Field of Classification Search ............... 385/131; 257/186
See application file for complete search history.

(56) References Cited

U.S. PATENT DOCUMENTS

| | | | |
|---|---|---|---|
| 5,280,189 A * | 1/1994 | Schuppert et al. ........... | 257/458 |
| 6,465,803 B1 * | 10/2002 | Bowers et al. ............... | 257/21 |
| 6,759,675 B1 | 7/2004 | Csutak et al. | |
| 2002/0195616 A1 * | 12/2002 | Bond ........................ | 257/186 |
| 2003/0165314 A1 | 9/2003 | Nagarajan et al. | |
| 2004/0251483 A1 | 12/2004 | Ko et al. | |
| 2005/0051861 A1 * | 3/2005 | Shi et al. ..................... | 257/438 |

OTHER PUBLICATIONS

Loudon, A., et al., "Enhancement of the Infrared Detection Efficiency of Silicon Photon-Counting Avalanche Photodiodes By Use of Silicon Germanium Absorbing Layers," *Optics Letters*, vol. 27, No. 4, Feb. 15, 2002, pp. 219-221.

Herbert, D. C., "Theory of SiGe Waveguide Avalanche Detectors Operating At $\lambda=1.3$ μm," *IEEE Transactions on Electron Devices*, vol. 45, No. 4, Apr. 1998, pp. 791-796.

Herbert, D. C., et al., "Impact Ionisation and Noise in SiGe Multiquantum Well Structures," *Electronics Letters*, vol. 32, No. 17, Aug. 15, 1996, pp. 1616-1618.

(Continued)

*Primary Examiner*—Michelle Connelly-Cushwa
*Assistant Examiner*—Rhonda S. Peace
(74) *Attorney, Agent, or Firm*—Blakely, Sokoloff, Taylor & Zafman LLP

(57) ABSTRACT

A semiconductor waveguide based optical receiver is disclosed. An apparatus according to aspects of the present invention includes an absorption region defined along an optical waveguide. The absorption region includes a first type of semiconductor material having a first refractive index. The apparatus also includes a multiplication region defined along the optical waveguide. The multiplication region is proximate to and separate from the absorption region. The multiplication region includes a second type of semiconductor material having a second refractive index. The first refractive index greater than the second refractive index such that an optical beam directed through the optical waveguide is pulled towards the absorption region from the multiplication region and absorbed in the absorption region to create electron-hole pairs from the optical beam. The multiplication region includes first and second doped regions defined along the optical waveguide. The first and second doped regions have opposite polarity to create an electric field to multiply the electrons created in the absorption region.

7 Claims, 2 Drawing Sheets

OTHER PUBLICATIONS

Shi, J., et al., "Design and Analysis of Separate-Absorption-Transport-Charge-Multiplication Traveling-Wave Avalanche Photodetectors," *Journal of Lightwave Technology*, vol. 22, No. 6, Jun. 2004.

Pauchard, A., et al., "High-Performance InGaAs-on-Silicon Avalanche Photodiodes," Wednesday Afternoon, OFC 2002, pp. 345-346.

Mikawa et al., "Germanium Reachthrough Avalanche Photodiodes for Optical Communication Systems at 1.55-μm Wavelength Region", IEEE Transactions on Electron Devices, vol. ED-31, No. 7, Jul. 1984, pp. 971-977.

Mikami et al., "Improved Germanium Avalanche Photodiodes", IEEE Journal of Quantum Electronics, vol. QE-16, No. 9, Sep. 1980, pp. 1002-1007.

* cited by examiner

SEMICONDUCTOR WAVEGUIDE-BASED AVALANCHE PHOTODETECTOR WITH SEPARATE ABSORPTION AND MULTIPLICATION REGIONS

CROSS-REFERENCE TO RELATED APPLICATIONS

This application is a divisional of, and claims priority under 35 U.S.C. § 120 from, U.S. patent application Ser. No. 11/121,511, filed May 3, 2005, and still pending.

BACKGROUND OF THE INVENTION

1. Field of the Invention

Embodiments of invention relate generally to optical devices and, more specifically but not exclusively relate to photodetectors.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) system provides a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers, lasers, optical switches and photodetectors. Photodiodes may be used as photodetectors to detect light by converting incident light into an electrical signal. An electrical circuit may be coupled to the photodetector to receive the electrical signal representing the incident light. The electrical circuit may then process the electrical signal in accordance with the desired application.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for semiconductor waveguide based avalanche photodetectors with separate absorption and multiplication regions are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1A:
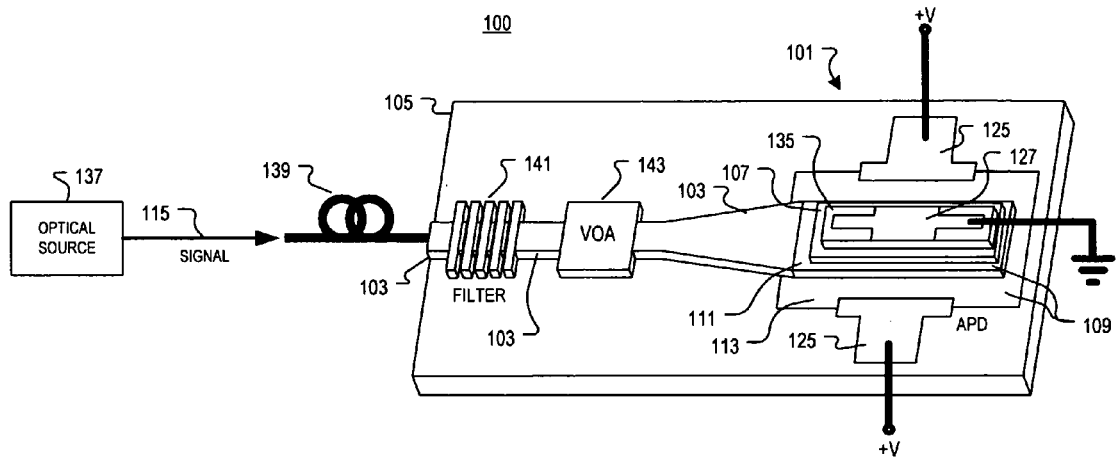
FIG. 1A is a block diagram illustrating an optical communication system including a semiconductor waveguide based avalanche photodetector with separate absorption and multiplication regions for an embodiment of the present invention.

FIG. 1A is a block diagram illustrating an optical communication system 100 including a semiconductor waveguide based avalanche photodetector (APD) 101 with separate absorption and multiplication regions for an embodiment of the present invention. As shown, an optical source 137 generates an optical beam 115. For one embodiment, a signal may be encoded on optical beam 115 such that data or information is carried in optical beam 115 in optical system 100. For one embodiment optical beam 115 may include infrared or near infrared wavelengths, such as for example 1,300 nanometers and/or 1,550 nanometers or the like. For another embodiment, optical beam 115 may include a range of wavelengths of light such as for example 1000 nanometer to 1500 nanometer light. As shown in FIG. 1A, an optical fiber 139 may be optically coupled to receive the optical beam 115 from the optical source 137. An optical receiver including an avalanche photodetector 101 may be optically coupled to receive the optical beam 115 to convert the signal in optical beam from an optical signal to an electrical signal.

The example illustrated in FIG. 1A shows that the optical receiver includes an optical waveguide 103 disposed in semiconductor material 105. Optical beam 115 is received from optical fiber 139 and is directed into optical waveguide 103. In the illustrated example, the optical beam 115 propagates along optical 103 through an integrated optical filter 141 defined in the optical waveguide 103 and then through an integrated variable optical attenuator (VOA) 143 defined optical waveguide 103 in semiconductor material 105. In the illustrated example, optical filter 141 includes a Bragg grating or the like integrated semiconductor material 105. The integrated variable optical attenuator 143 may be used to variably attenuate optical beam 115 as it propagates through optical waveguide 103 for an embodiment of the present invention.

As optical beam 115 continues to propagate along optical waveguide 103, optical beam 115 reaches an avalanche photodetector 101 portion of optical waveguide 103 including an absorption region 107 defined along optical waveguide 103 as well as a multiplication region 109 defined along optical waveguide 103 proximate to absorption region 107. It is noted that the portions of optical waveguide 103 between the avalanche photodetector 101 portion of optical waveguide 103 and optical fiber 139, including optical filter 141 and variable optical attenuator 143, are not required and that optical fiber 139 may be directly coupled to the avalanche photodetector 101 portion of optical waveguide 103 for an embodiment of the present invention.

Figure 1B:
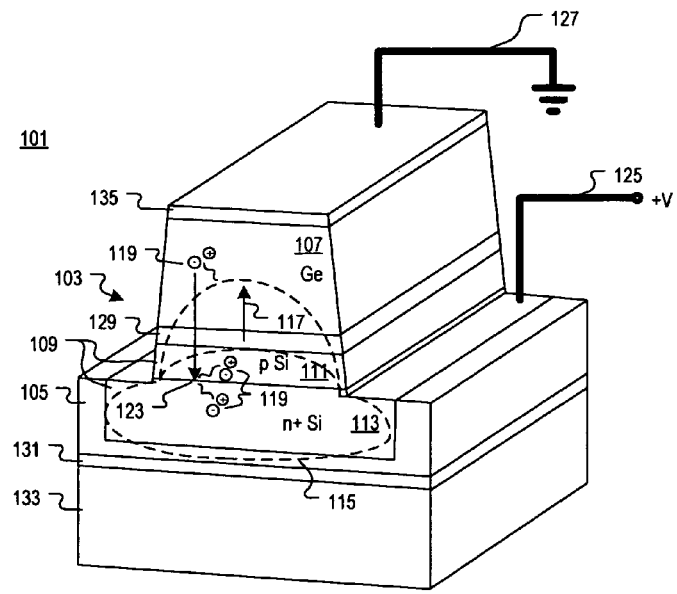
FIG. 1B is a diagram illustrating cross-section view of a semiconductor waveguide based avalanche photodetector with separate absorption and multiplication regions for an embodiment of the present invention.

FIG. 1B is an illustration showing increased detail with a cross-section view of a semiconductor waveguide based avalanche photodetector 101 with separate absorption and multiplication regions for an embodiment of the present invention. As can be observed in FIGS. 1A and 1B, the absorption region 107 includes a first type of semiconductor material and the multiplication region 109 includes a second type of semiconductor material. The multiplication region 109 includes first and second doped regions 111 and 113 defined along the optical waveguide 103. The doped regions 111 and 113 are doped with opposite polarity dopants, which create a high electric field at the interface or junction between the doped regions 111 and 113 of the multiplication region 109. For instance, doped region 111 may include p-type dopants and doped region 113 may include n-type dopants, which results in a p-n junction at the interface between doped regions 111 and 113 of the multiplication region 109.

For one embodiment, the first type of semiconductor material included in absorption region 107 is mostly or primarily intrinsic or lightly doped Germanium (Ge). For purposes of this disclosure, absorption region 107 including "mostly" or "primarily" germanium is to be interpreted as the first semiconductor material including mainly germanium or more germanium than any other material. Thus, absorption region 107 has a relatively high refractive index such as approximately 4.0. In addition, with absorption region 107 including primarily germanium, optical beam 115 is absorbed at wavelengths such as 1,300 or 1,550 nanometers or other wavelengths in the infrared or near infrared light ranges. It is noted that absorption region 107 is not based on a quantum well active area with the attendant film thickness constraints, but rather on a relatively thicker-film approach. Other wavelengths of light may also be absorbed with absorption region 107. For example, light having wavelengths in the range of 1000 to 1300 nanometers or the like may also be absorbed in absorption region 107 for an embodiment of the present invention.

For one embodiment, the second type of semiconductor material included in the doped regions 111 and 113 of multiplication region 109 includes a semiconductor material having a lower refractive index compared to the refractive index of the absorption region 107. For example, silicon (Si) is included in doped regions 111 and 113 of multiplication region 109 for an embodiment of the present invention. Using silicon in the doped regions 111 and 113 of multiplication region 109 results in multiplication region 109 having a refractive index of approximately 3.5, which is a lower refractive index relative to the refractive index of the germanium in absorption region 107 for an embodiment of the present invention.

With reference to the cross-section view shown in FIG. 1B, a cross-section view of the intensity profile of the optical mode of optical beam 115 is illustrated with the dashed line propagating through optical waveguide 103. As can be seen, optical waveguide 103 is a rib waveguide for an embodiment of the present invention. In the illustration, the doped region 113 of the multiplication region 109 is defined in the slab region primarily with a portion of multiplication region 109 defined in the rib region along optical waveguide 103 for an embodiment of the present invention. The doped 111 region of the multiplication region 109 is defined in the rib region along optical waveguide 103. The absorption region 107 is defined proximate to and separate from the multiplication region 109 along the optical waveguide 103. In the illustrated example, absorption region 107 is defined in the rib region along optical waveguide 103 with a thin intervening layer 129 disposed between the absorption region 107 and the multiplication region. Intervening layer 129 may include semiconductor material such as for example intrinsic silicon or the like to separate the germanium of absorption region 107 from the doped region 111 of multiplication region 109. In the illustrated example, optical waveguide 103 is show being disposed in a silicon-on-insulator (SOI) wafer with an insulating layer 131 disposed between semiconductor material layer 105 and semiconductor material layer 133.

As illustrated in FIG. 1B, one or more contacts 125 and 127 are coupled to the doped region 113 of multiplication region 109 and to the absorption region 107, respectively. In the illustrated example, contact 125 is coupled to a positive voltage V+ and contact 127 is coupled to ground. Accordingly, a low electric field is created between absorption region 107 and multiplication region 109. The electric field created between absorption region 107 and multiplication region 109 with the biasing of contacts 125 and 127 is lower than the relatively high electric field created at the junction between the doped regions 111 and 113 of multiplication region 109. In the illustrated example, a doped layer 135 is shown being disposed between contact 127 and absorption region 107 to provide an improved electrical coupling with reduced resistance between absorption region 107 and contact 127. For example, doped layer 135 may include p-doped germanium or silicon or the like to improve the electrical coupling of absorption region 107 to contact 127 to ground for an embodiment of the present invention.

In operation, optical beam 115 is directed along optical waveguide 103, as shown with the dashed line in FIG. 1B. Since the absorption region 107 has a higher refractive index than multiplication region 109, optical beam 115 is pulled towards absorption region 107 from multiplication region 109, as shown in FIG. 1B with arrow 117. Optical beam 115 is then absorbed in absorption region 107, which creates photocarriers or electron-hole pairs 119 being generated from optical beam 115 in absorption region 107, as illustrated in FIG. 1B. The low electric field between the absorption region 107 and the multiplication region 109 accelerates the photocarriers or electron-hole pairs 119 generated in the absorption region 107 such that some of the electrons from the electron-hole pairs 119 generated in absorption region 107 therefore drift into the multiplication region 109, which is under the much higher electric field at the junction between doped regions 111 and 113. Since the electric field is so high at the junction between doped regions 111 and 113, impact ionization 123 occurs with the electrons that drift from absorption region 107 into multiplication region 109.

As illustrated in FIG. 1B, additional electrons-hole pairs 119 are created or multiplied at the junction between doped regions 111 and 113 as a result of the impact ionization 123 from the electrons that drift from absorption region 107 into the high electric field at the junction between doped regions 111 and 113. Therefore, the photocurrent created from the absorption of optical beam 115 in absorption region 107 is multiplied or amplified in the multiplication region 109 for an embodiment of the present invention. The photocarriers are then collected at contacts 125 and 127. For instance, holes may be collected at contact 127 and electrons are collected at contact 125. Contacts 125 and 127 may be coupled to electrical circuitry to process the signal present at contacts 125 and 127 as a result of the absorption of optical beam 115 in absorption region 107 and the multiplication of the photocarriers in multiplication region 109. Therefore, an optical signal encoded in optical beam 115 is therefore converted into an electrical signal at the contacts 125 and 127, which may then be electrically processed by an electrical circuit coupled to contacts 125 and 127 for an embodiment of the present invention.

Figure 2:
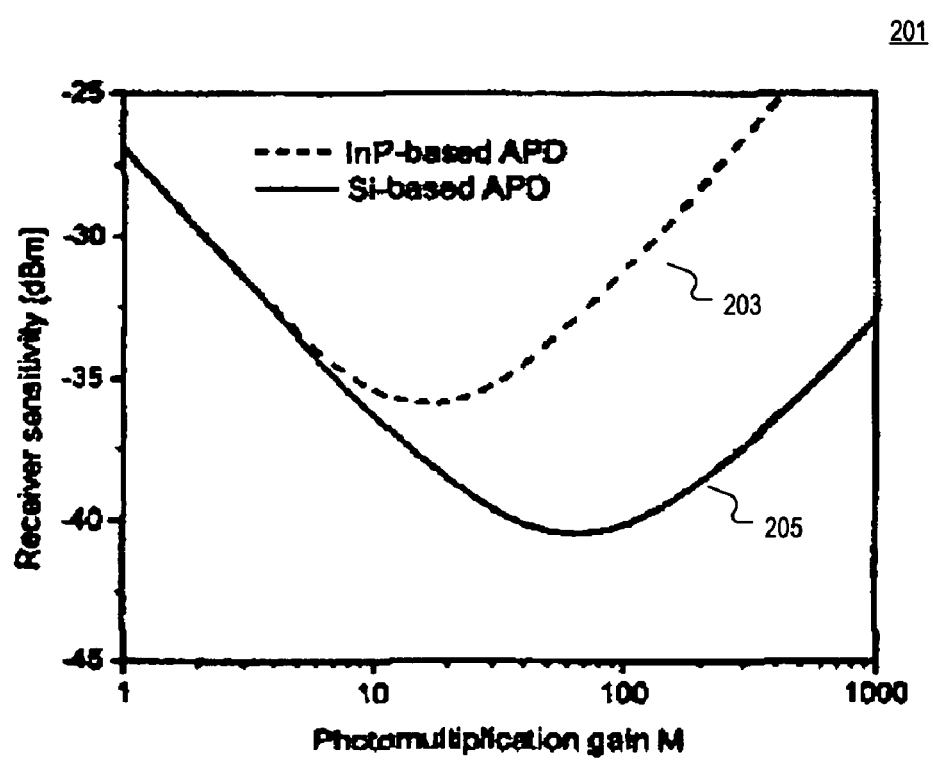
FIG. 2 is a diagram illustrating an improvement in sensitivity with the use of silicon in the multiplication region of a semiconductor waveguide based avalanche photodetector with separate absorption and multiplication regions for an embodiment of the present invention.

As mentioned above, multiplication region 109 includes silicon for an embodiment of the present invention. FIG. 2 is a diagram 201 illustrating an improvement in sensitivity that is realized for an embodiment of an avalanche photodetector 101 utilizing silicon in multiplication region 109 instead of another material, such as for example indium phosphide (InP). In particular, diagram 201 shows a relationship between a receiver sensitivity dBm versus photomultiplication gain M for various embodiments of an avalanche photodectector 101. In particular, plot 203 shows a receiver sensitivity versus photomultiplication gain relationship for an indium phosphide based avalanche photodetector while plot 205 shows a receiver sensitivity versus photomultiplication gain relationship for silicon based avalanche photodetector. As can be observed in FIG. 2 by comparing plots 203 and 205, receiver sensitivity is improved by approximately 4–5 dB by using a silicon based avalanched photodetector instead of an indium phosphide based avalanche photodetector for an embodiment of the present invention. This shows that less power is therefore needed using silicon instead of indium phosphide in multiplication region 109 to accurately detect a signal encoded in an optical signal received by an avalanche photodetector for an embodiment of the present invention.

The utilization of silicon in the multiplication region 109 for an embodiment of the present invention improves sensitivity of the avalanche photodetector 101 as shown in FIG. 2 because of the impact ionization properties of the electrons and holes in the material. For an embodiment of the present invention, substantially only one type of carrier, in particular electrons, are able to achieve impact ionization 123 because of the use of silicon in multiplication region 109. This can be seen quantitatively with the k-factor, which is the ratio of impact ionization coefficients of holes to electrons. Silicon has a k-factor about one order of magnitude lower than, for example, indium phosphide. A result of the use of silicon is that substantially only electrons are selectively multiplied or amplified in multiplication region 109 instead of holes. Thus, noise and instability in avalanche photodetector 101 is reduced for an embodiment of the present invention compared to a material with a higher k-factor. An equation showing the excess noise tied to the k-factor (k) is:

$$F_A(M)=kM+(1-k)(2-(1/M)) \quad \text{(Equation 1)}$$

where $F_A$ is the excess noise factor and M is the gain of the avalanche photodetector.

The chances of runaway resulting from the generation more than one type of carrier in multiplication region 109 is substantially reduced because substantially only electrons are able to achieve impact ionization 123 by using silicon of multiplication region 109 for an embodiment of the present invention. To illustrate, the k-factor value of silicon for an embodiment of the present invention is less than 0.05 or approximately 0.02–0.05. In comparison, the k-factor value for other materials such as for example indium gallium arsenide (InGaAs) is approximately 0.5–0.7 while the k-factor value for germanium is approximately 0.7–1.0. Thus, the k-factor value using silicon for an embodiment of the present invention is less than other materials. Therefore, using silicon for an embodiment of an avalanche photodetector in multiplication region 109 results in improved sensitivity over avalanche photodetectors using other materials such as indium gallium arsenide or germanium or the like.

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent refinements and modifications are possible, as those skilled in the relevant art will recognize. Indeed, it is appreciated that the specific wavelengths, dimensions, materials, times, voltages, power range values, etc., are provided for explanation purposes and that other values may also be employed in other embodiments in accordance with the teachings of the present invention.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A method, comprising:
   directing an optical beam into an optical waveguide disposed in a semiconductor material, the optical waveguide including an absorption region defined along the optical waveguide comprising a first type of semiconductor material having a first refractive index, the optical waveguide further including a multiplication region defined along the optical waveguide comprising a second type of semiconductor material having a second refractive index, the first refractive index being greater than the second refractive index;
   pulling a mode of the optical beam towards the absorption region from the multiplication region in response to the first refractive index being greater than the second refractive index;
   absorbing the optical beam in the absorption region to create electron-hole pairs from the optical beam; and
   selectively multiplying electrons created in the absorption region that drift into the multiplication region along the optical waveguide.

2. The method of claim 1 further comprising accelerating the electrons created in the absorption region that drift into the multiplication region in response to a high electric field in the multiplication region.

3. The method of claim 1 wherein the multiplying of the electrons created in the absorption region that drift into the multiplication region is in response to impact ionization in the multiplication region.

4. The method of claim 1 wherein the selection of the electrons to multiply the multiplication region is in response the second type of silicon having a k-factor value of less than approximately 0.05.

5. The method of claim 1 wherein the optical beam comprises infrared or near infrared light.

6. The method of claim 1 wherein the first type of semiconductor material substantially comprises germanium and the second type of semiconductor material substantially comprises silicon.

7. The method of claim 1 wherein the first refractive index is approximately equal to 4 and the second refractive index is approximately equal to 3.5.

* * * * *